United States Patent [19]
Bayraktaroglu

[11] Patent Number: 5,512,776
[45] Date of Patent: Apr. 30, 1996

[54] INTERDIGITATED IMPATT DEVICES

[75] Inventor: Burhan Bayraktaroglu, Plano, Tex.

[73] Assignee: Texas Instruments Incorporated, Dallas, Tex.

[21] Appl. No.: 192,801

[22] Filed: May 11, 1988

Related U.S. Application Data

[60] Continuation-in-part of Ser. No. 849,320, Apr. 8, 1986, abandoned, which is a division of Ser. No. 630,486, Jul. 13, 1984, Pat. No. 4,596,070.

[51] Int. Cl.[6] .................................................. H01L 29/864
[52] U.S. Cl. ........................ 257/604; 257/199; 257/276; 257/522
[58] Field of Search ................................. 357/55, 49, 13, 357/81, 56, 68, 3; 257/199, 604, 276, 522

[56] References Cited

U.S. PATENT DOCUMENTS

| | | | |
|---|---|---|---|
| 4,379,307 | 4/1983 | Soclof | 357/68 |
| 4,499,659 | 2/1985 | Varteresian et al. | 357/56 |
| 4,596,070 | 6/1986 | Bayraktaroglu | 357/56 |

*Primary Examiner*—Jerome Jackson
*Attorney, Agent, or Firm*—Michael K. Skrehot; James C. Kesterson; Richard L. Donaldson

[57] ABSTRACT

A monolithic circuit including an IMPATT with the IMPATT formed as a plurality of parallel vertical fingers or an array of vertical mesas having a common doped region to apread the area for heat dissipation through the substrate.

7 Claims, 3 Drawing Sheets

INTERDIGITATED IMPATT DEVICES

STATEMENT AS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonsable terms as provided for by the terms of Contract No. N00123-81-C-1228 awarded by the U.S. Navy and Contract No. DAAL001-86-C-0002 awarded by the U.S. Army.

CROSS-REFERENCE TO RELATED APPLICATIONS

This application is a continuation-in-part of U.S. application Ser. No. 849,320, filed Apr. 8, 1986, now abandoned which is a divisional of U.S. application Ser. No. 630,486, filed Jul. 13, 1984, now U.S. Pat. No. 4,596,070. applications Ser. No. 630,485, filed Jul. 13, 1984 and now U.S. Pat. No. 4,596,069; Ser. No. 849,312, filed Apr. 8, 1986 and now U.S. Pat. No. 4,692,791; Ser. No. 697,301, filed Jan. 31, 1985 and now U.S. Pat. No. 4,673,958; Ser. No. 868,212, filed May 28, 1986 and now U.S. Pat. No. 4,706,041; Ser. No. 058,305, filed Jun. 5, 1987; Ser. No. 067,527, filed Jun. 26, 1987; and Ser. No. 082,027, filed Aug. 5, 1987 disclose related subject matter.

BACKGROUND OF THE INVENTION

1. Field of the Invention

The present invention relates to semiconductor electronic devices, and, more particularly, to IMPATT diode devices and methods of fabrication.

2. Description of the Related Art

Monolithic semiconductor circuits wherein complete circuits are provided on a single semiconductor substrate have been well known for many years. Such prior art semiconductor substrates have had the advantage of close proximity to each other of the circuit elements therein, this feature being extremely important as the frequencies utilized increase. These prior art monolithic circuits have required that all of the components be formed in a substrate containing a single semiconductor material and have also required that the processing steps for all of the components therein be compatible with each other within the bounds of economics. For this reason, when it has become necessary to provide circuits utilizing substrates of differing semiconductor materials or of the same semiconductor material but wherein the processing steps were incompatible, it has been necessary to use a plurality of semiconductor chips to provide the desired circuit configuration. A typical example of this problem exists in the fabrication of a circuit utilizing an IMPATT structure and associated circuitry containing FETs, varactors, etc., wherein operation is in the microwave region. In such cases, it is necessary due to the totally incompatible processing techniques in formation of IMPATTS relative to other standard circuitry that the IMPATT be formed on a separate semiconductor chip. This has presented a problem in the prior art in that it is desirable that the components be as close together as possible in the microwave operating region to prevent a limit in device performance due to the transitions that exist.

In addition to the above, it is well known that IMPATT devices dissipate a great deal of heat and require efficient heat sinking for proper operation. This has created a problem in the past because the gallium arsenide substrate material is not a very good heat sink and is capable of conducting only approximately one tenth the amount of heat that a similar amount of gold or silver is capable of conducting. One prior art approach, wherein a monolithic circuit is provided utilizing an IMPATT and other circuit components, is set forth in my application Ser. No. 630,485, filed Jul. 13, 1984 and now U.S. Pat. No. 4,596,069 and Ser. No. 849,312, filed Apr. 8, 1986 and now U.S. Pat. No. 4,692,791 wherein a metal heat sink is formed to extend through the monolithic circuit, thereon. This approach requires the additional steps of forming the metal heat sink. It is therefore desirable to create monolithic circuits of the type described herein and in said copending application wherein the processing steps required can be minimized.

SUMMARY OF THE INVENTION

In accordance with the present invention, there is provided a monolithic semiconductor circuit and method of making same wherein the components of the circuit are all formed on a single substrate of semiconductor material and wherein the heat sinking for an IMPATT device which forms a part of the circuit is provided through the substrate itself.

Briefly, in accordance with the present invention, a semiconductor substrate is provided, gallium arsenide being utilized in the preferred embodiment herein, having an active area for formation of an IMPATT device. The IMPATT device is then formed as a plurality of separated fingers having a common n+ region to spread the area over which the IMPATT is disposed and provide such additional area for dissipation of heat through the substrate. The device is produced by metallizing the active region in the area where the fingers forming the IMPATT device are to be formed and then etching the active surface down to the n+region, but leaving a portion thereof so that the n+regions of the various fingers are interconnected. The wells formed between the fingers are then metallized and the excess n+ layer is etched to form a mesa structure around the IMPATT device and isolate the active region of each device. A polyimide insulation material is then deposited over the IMPATT device and between the fingers by spin coating so that the polyimide extends above the fingers. The polyimide is then fully cured to remove solvents and etched back isotropically, for example in an oxygen plasma formed in planar plasma system so that only the top portions of the fingers extend through the polyimide. The top portions of the fingers are then interconnected by depositing a metal on the polyimide which contacts metallization on the top portions of the fingers. The metallization on the n+ regions and the metallization on the top portions of the fingers are now connected in standard manner to separate circuits which may be in the form of microstrip lines, for example, which is deposited elsewhere on the substrate to provide a resonant circuit on the single substrate. It should be understood that other types of circuits can also be provided with interconnection to the IMPATT.

Other embodiments have the IMPATT as a matrix of separated mesas (instead of the plurality of separated fingers) on a common n+ region and without the polyimide but with air bridges interconnecting the top portions of the mesas.

The formation of the IMPATT as a plurality of separated fingers or mesas provides the additional area required to equalize the heat sinking capability provided by use of a metal heat sink on which is disposed a single disk shaped IMPATT device.

DESCRIPTION OF THE PREFERRED EMBODIMENTS

Figure 1A:
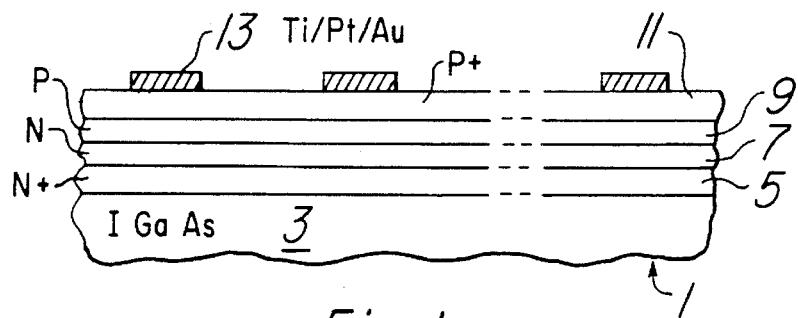
FIGS. 1(a) through 1(d) are schematic diagrams of the processing steps utilized in forming a monolithic semiconductor circuit in accordance with the present invention.

Referring now to FIGS. 1(a) through 1(d), there is shown a schematic diagram of the processing steps utilized in formation of a monolithic semiconductor circuit in accordance with a first preferred embodiment of the present invention. In accordance with the process as shown in FIG. 1(a), there is provided a gallium arsenide substrate 1 having an intrinsic substrate portion 3 and an active region above the intrinsic region which is composed of an n+ region 5, an n-type region 7, a p-type region 9 and a p+ region 11 which is formed on the top surface of the active region. This is the standard IMPATT type of structure. Other portions of the substrate 1 can be formed merely having an active layer of another type thereon or having no active region whatsoever but being capable of receiving or having formed circuit elements thereon or therein. The top surface of the substrate 1 is then masked with an appropriate mask, as is well known and metallization 13 is formed on those regions where the fingers of the IMPATT device are to be formed. The metallization is preferably formed by placing on the active layer surface a layer of titanium of about 1,000 Angstroms and then a layer of platinum of about 500 Angstroms and then a layer of gold of about one half to 1 micron. The resist is then removed to provide the structure as shown in FIG. 1(a).

Figure 1B:
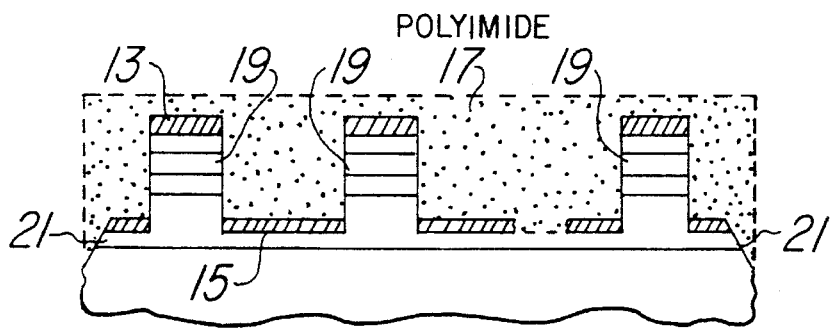

The structure of FIG. 1(a) is then etched with a gallium arsenide etchant, such as hydrogen peroxide-sulfuric acid, as is well known, or in a $BCl_3$ or $CCl_2F_2$ plasma, with the etch continuing through the layers 11, 9, 7 and a portion of 5 so that all of the n+ region 5 are still connected together. The exposed surface of the n+ region 5 has a metallization layer 15 formed thereon in the same manner as the metallization layer 13. The n+ layer is then etched with a hydrogen peroxide-sulfuric acid etchant with a protective layer of photoresist or an inorganic insulator such as silicon nitride as a mask so that the n+ layer is removed around the edges of the IMPATT device at the mesa regions 21 to isolate the IMPATT from other circuitry already formed or to be later formed on the remainder of the substrate 1. Then a polyimide layer 17 is formed over the entire IMPATT structure which extends above the fingers 19 which have been formed as explained hereinabove. A polyimide, such as Dupont polyimide 2555 is utilized, it being required that the polyimide or other material having similar properties be a good insulator and be compatible with the processing steps utilized. The structure at this point is as shown in FIG. 1(b).

Figure 1C:
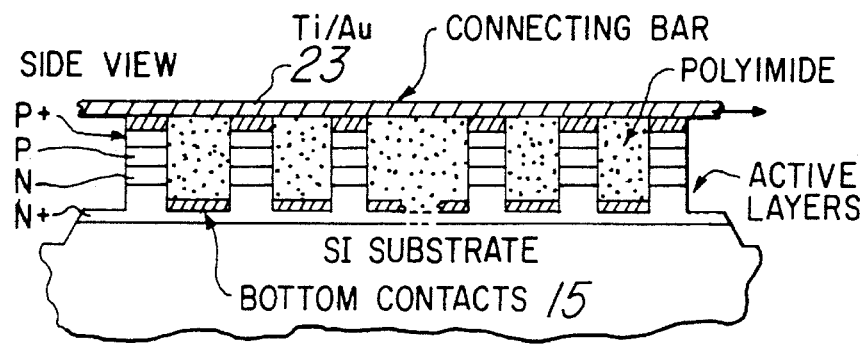
Figure 1D:
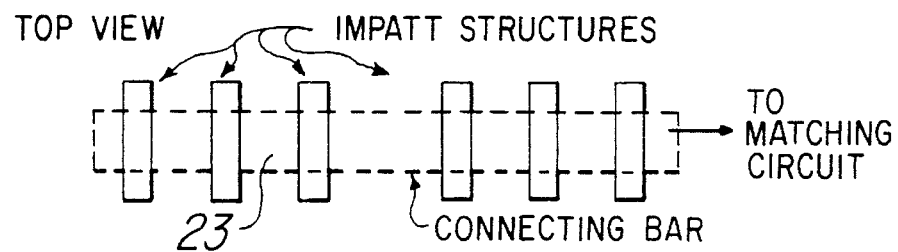

The polyimide 17 is then etched back by an oxygen plasma burn off until the top metallization regions 13 extend through the polyimide 17 as shown in FIG. 1(c). The metallization regions 13 are then connected together by forming a connecting bar 23 which connects all of the metallization regions 13 together and rests on the surface of the polyimide 17. This connecting bar 23 is preferably formed by evaporation of a very thin layer of titanium which will adhere to the polyimide and gold followed by metallization with a plating of gold over the evaporated gold to provide the good electrically conducting property required. The result will be the structure shown in FIG. 1(c) and FIG. 1(d), the latter being a top view of the structure shown in FIG. 1(c) which is a side view thereof.

Figure 2:
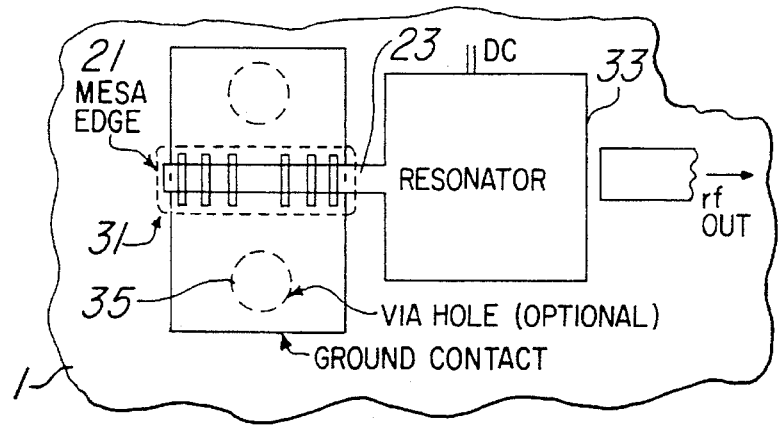
FIG. 2 is a schematic diagram of a monolithic resonator circuit formed in accordance with the first preferred embodiment of the present invention.

It can be seen that there has been formed an IMPATT structure which is electrically isolated from other portions of the substrate 1 and which is spread over a large area relative to prior art IMPATT devices of the same size to provide additional heat dissipation. Typical parameters and parameter ratios for the fingers and spacing therebetween are two microns width by twenty micron length for the fingers 19 with a spacing between fingers of about ten microns. The two conductors for the IMPATT device terminals have been formed, these being the connecting bar 23 and the bottom contact 15. Referring now to FIG. 2, there is shown a resonator circuit formed on a substrate 1 as a monolithic circuit in accordance with the present invention. There is shown the IMPATT device 31 on the substrate 1 with the mesa edge 21 therearound as also shown in FIG. 1(b) with the connecting bar 23 which is a part of the resonator circuitry coupled to a microwave circuit 33 formed on the substrate 1 and which provides a resonator circuit. The bottom contact 15 can, for example, extend through an aperture or apertures 35 in the substrate to connect to ground metallization to provide a reference potential to the other electrode of the IMPATT device. Alternatively, the bottom contact 15 can extend to a pad (not shown) with the pad being connected to a further conductor in standard manner.

Figure 3A:
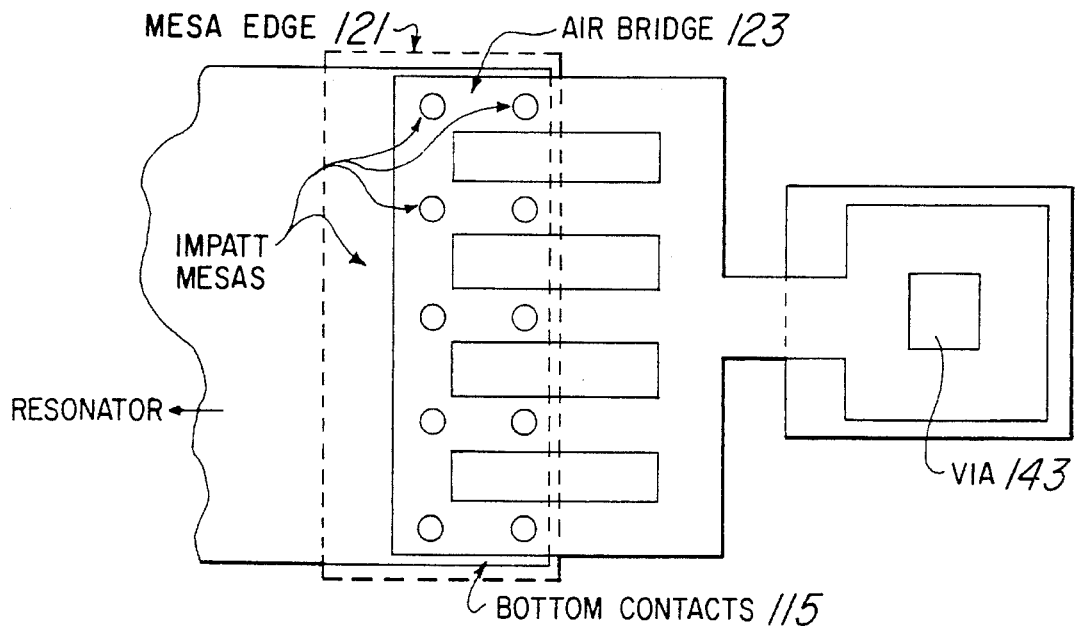
FIGS. 3(a) and 3(b) are schematic plan and cross sectional elevation views of a second preferred embodiment.
Figure 3B:
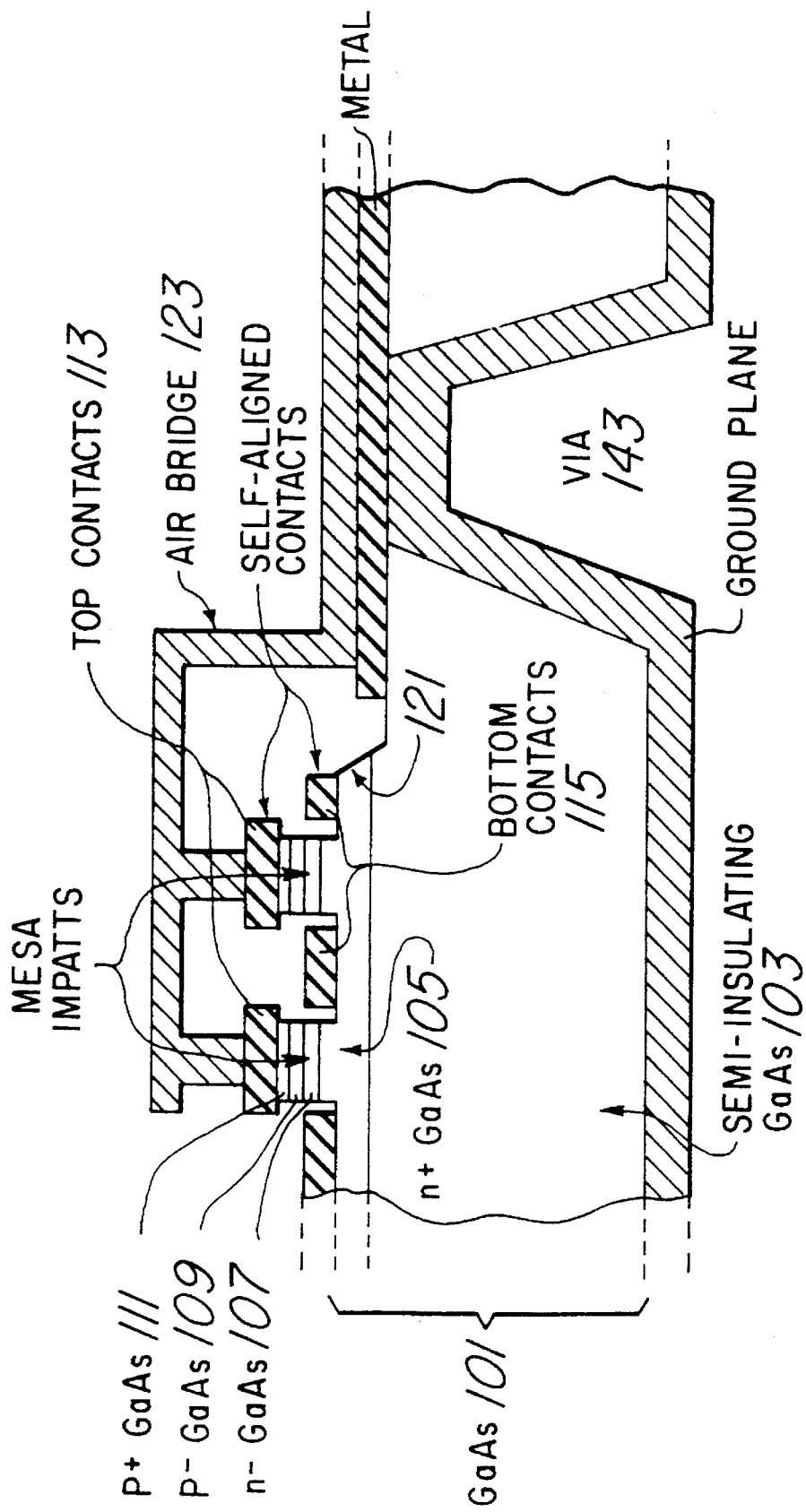

FIG. 3(a) illustrates in plan view and FIG. 3(b) illustrates in cross sectional elevation view a second preferred embodiment IMPATT device integrated on a 0.1 mm thick GaAs substrate 101. Substrate 101 includes a semi-insulating region 103 and an active region on semiinsulating region 103 composed of an n+ region 105, an n-type region 107, a p-type region 9 and a p+ region 111 which is formed on the top surface of the active region. This is the standard IMPATT structure and the same as the first preferred embodiment except that instead of parallel fingers the IMPATT is formed as a 2 by 5 array of 5 micron diameter mesas spaced 25 microns center-to-center. The active region is mesa isolated from other circuitry formed on the remainder of substrate 101, the mesa edge is shown as reference numeral 121 in the Figures.

The doping levels and thicknesses of the active region layers is as follows: n+ layer 105 is 1.0 micron thick and doped $3 \times 10^-$ per $cm^3$, n layer 107 is 0.3 micron thick and doped $1.6 \times 10^{17}$ per $cm^3$, p layer 109 is 0.25 micron thick and doped $2 \times 10^{17}$ per $cm^3$, and p+ layer 111 is 0.3 micron thick and doped $5 \times 10^{18}$ per $cm^3$. Because the IMPATT device area is divided into the ten mesas, the total device edge to area ratio is large and surface leakage currents may be a problem. Thus a 0.2 micron thick, plasma-enhanced-deposition silicon nitride layer is deposited after IMPATT formation as passivation; this passivation is not shown in the Figures for clarity. Ground plane 103 is plated on the backside of substrate 101 and connected to the frontside by vias such as via 143. The top contacts 113 and bottom contacts 115 are formed as in the first preferred embodiment and are also made of Ti/Pt/Au. Air bridge 123 connects the IMPATT top contacts 113 and is formed by standard photoresist patterning followed by gold plating; air bridge 123 extends vertically 4.5 microns from bottom contacts 115 for low capacitance. Top contacts 113 are connected by air bridge 123 to ground through via 143 in the second preferred embodiment, and bottom contacts 115 connect to a resonator.

It can be seen that there has been provided a simple monolithic circuit utilizing an IMPATT device and wherein heat sinking is available from the substrate itself.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

MODIFICATIONS AND ADVANTAGES

Various modifications of the preferred embodiment devices and methods may be made while retaining the features of For example, the dimensions and shapes and number of fingers or mesas (round, square, or other shape) forming the IMPATT device can be varied, although for lumped element operation the largest dimensions of the IMPATT array should be small compared to the wavelength at the operating frequency. Similarly, the double-drift IMPATT structure could be replaced with a one-sided abrupt p-n junction, a Read diode, a modified Read diode, p-i-n diode, and so forth. Also, other semiconductor material may be used such as InP, GaP, InGaAs, and so forth. Either the top contacts or the bottom contacts can be connected to ground with the remaining contacts connected to the other circuitry.

The invention provides the advantages of good IMPATT heat sinking while maintaining lumped mode of operation in a monolithic circuit.

What is claimed is:

1. A monolithic semiconductor structure, comprising:
   (a) a semiconductor substrate;
   (b) an IMPATT device formed on said substrate and electrically isolated from other surface regions of said substrate, said IMPATT device including:
      i. a plurality of stacks, each of said stacks vertical from said substrate and including a heavily doped top portion, a lightly doped middle portion, and a heavily doped bottom portion with doping type opposite that of said top portion, said stacks spaced from each other to provide heat dissipation through said substrate and with said bottom portions joined to a common active layer, and
      ii. a connector electrically coupling together said top portions of said stacks remote from said substrate.
2. The structure of claim 1, wherein:
   (a) said common active layer is an n+ layer of GaAs;
   (b) said top portions are p+ GaAs; and
   (c) said substrate is GaAs.
3. The structure of claim 1, further including:
   (a) active and/or passive electrical circuit elements formed on said substrate and electrically coupled to said IMPATT device.
4. The structure of claim 3, wherein:
   (a) said electrical circuit elements are connected to said connector.
5. The structure of claim 1, further including:
   (a) a contact coupled to said common active layer and located between said stacks.
6. The structure of claim 1, wherein:
   (a) said stacks are parallel fingers.
7. The structure of claim 1, wherein:
   (a) said connector is metal on polyimide located between said stacks.

* * * * *